United States Patent
Suzuki et al.

(10) Patent No.: US 12,205,795 B2
(45) Date of Patent: Jan. 21, 2025

(54) PLASMA PROCESSING DEVICE

(71) Applicant: ULVAC, INC., Chigasaki (JP)

(72) Inventors: Taichi Suzuki, Chigasaki (JP);
Yasuhiro Morikawa, Chigasaki (JP);
Kenta Doi, Chigasaki (JP); Toshiyuki Nakamura, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 331 days.

(21) Appl. No.: 17/829,144

(22) Filed: May 31, 2022

(65) Prior Publication Data

US 2022/0392746 A1    Dec. 8, 2022

(30) Foreign Application Priority Data

Jun. 3, 2021  (JP) ................................ 2021-093324

(51) Int. Cl.
*H01J 37/32* (2006.01)

(52) U.S. Cl.
CPC ..... *H01J 37/3211* (2013.01); *H01J 37/32091* (2013.01); *H01J 2237/20* (2013.01)

(58) Field of Classification Search
CPC .................. H01J 37/32091; H01J 37/3211
See application file for complete search history.

(56) References Cited

U.S. PATENT DOCUMENTS

2006/0175016 A1* 8/2006 Edamura ........... H01J 37/32091
                                                      156/345.48
2014/0225503 A1   8/2014 Mori et al.
2015/0311038 A1* 10/2015 Park ..................... H01J 37/3211
                                                      315/111.21
2015/0357210 A1* 12/2015 Mori ................. H01J 37/32926
                                                      156/345.28
2018/0068835 A1*  3/2018 Satake ..................... C23C 16/52
2021/0193619 A1*  6/2021 Fettke ..................... H01L 24/17

FOREIGN PATENT DOCUMENTS

| JP | 2003209098 | 7/2003 |
| JP | 2006216903 | 8/2006 |
| JP | 2013-157528 A | 8/2013 |
| TW | I593016 | 7/2017 |

OTHER PUBLICATIONS

"Japanese Application Serial No. 2021-093324, Notice of Reasons for Refusal mailed Feb. 21, 2023", w/ English Translation, 10 pgs.
"Taiwanese Application Serial No. 111118477, Office Action mailed Jul. 12, 2023", w/ English Machine Translation, 8 pgs.

* cited by examiner

*Primary Examiner* — Joseph A Miller, Jr.
(74) *Attorney, Agent, or Firm* — Schwegman Lundberg & Woessner, P.A.

(57) ABSTRACT

A plasma processing device includes an inductively coupled plasma antenna including an input end and an output end, a series circuit including an additional inductor and a variable capacitor connected in series, and a controller that varies a capacitance of the variable capacitor. The input terminal is connected via an antenna matching device to an antenna power supply. The output terminal is connected to the additional inductor. The additional inductor is connected via the variable capacitor to ground.

6 Claims, 2 Drawing Sheets

PLASMA PROCESSING DEVICE

CLAIM OF PRIORITY

This application claims the benefit of priority under 35 U.S.C. § 119 to Japanese Patent Application No. 2021-093324, Jun. 3, 2021, which is incorporated by reference herein in its entirety.

TECHNICAL FIELD

The following description relates to a plasma processing device.

BACKGROUND

An etching device, which is one example of a plasma processing device, includes a coil antenna that generates plasma. The coil antenna includes an input end, connected via a matching circuit to a high-frequency power supply, and an output end, connected to ground (refer to Japanese Laid-Open Patent Publication No. 2013-157528). The plasma density distribution may be changed by, for example, arranging a variable capacitor between the coil antenna and ground. The capacitance of the variable capacitor is controlled to move the resonance point and change the plasma density distribution.

SUMMARY

When the output terminal of the coil antenna is connected via the variable capacitor to ground, there is a limit, in principle, to how close the resonance point can approach the output terminal. Thus, improvements can be made to allow the resonance point to be arranged closer to the output terminal of the coil antenna. This situation is not unique to etching devices and also applies to other plasma processing devices such as a sputtering device and a CVD device.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An embodiment of a plasma processing device includes a coil antenna including an input end and an output end, a series circuit including an additional inductor and a variable capacitor connected in series, and a controller that varies, or is configurable to vary, a capacitance of the variable capacitor. The input end is connected via a matching circuit to a high-frequency power supply. The output terminal is connected to the additional inductor. The additional inductor is connected via the variable capacitor to ground.

In the configuration described above, the controller varies the capacitance of the variable capacitor. This allows the position of a resonance point to be controlled. Further, the additional conductor, which is disposed between the coil antenna and the variable capacitor, allows the resonance point to be arranged closer to the output end of the coil antenna.

Preferably, in the plasma processing device described above, the controller sets a range for the capacitance of the variable capacitor that includes a first capacitance. The first capacitance is a capacitance of the variable capacitor within the range and corresponds to a resonance point located at a position that is closest to the output terminal. The controller executes a process for setting the capacitance of the variable capacitor to the first capacitance when initiating generation of plasma with the coil antenna.

The generation of plasma with the coil antenna is initiated by the generation of capacitive plasma. When the resonant point is close to the output end of the coil antenna, the peak-to-peak value at the input end is the maximum. The coil antenna moves the resonance point to a position closer to the output end when the generation of plasma is initiated. Thus, the coil antenna stably initiates the generation of plasma.

Preferably, in the plasma processing device described above, the controller uses a peak-to-peak value at the input end after the generation of plasma is initiated to specify the capacitance of the variable capacitor for moving the resonance point from the output end toward the input end.

As the resonant point moves from the output end toward the input end, the peak-to-peak value at the input end decreases. As long as the capacitance can be specified with the peak-to-peak value at the input end, the resonance point can be accurately moved from the output end toward the input end. The generation of plasma with the coil antenna induces inductive plasma from capacitive plasma. Movement of the resonance point from the output end toward the input end maximizes and then decreases the peak-to-peak value at the input end. This avoids a biased distribution of capacitive plasma when inductive plasma is induced. As a result, plasma can be uniformly distributed when inductive plasma is induced.

Preferably, in the plasma processing device described above, the controller further uses a peak-to-peak value at the output terminal to specify the capacitance of the variable capacitor.

As the resonance point moves from the output end toward the input end, the peak-to-peak value at the output end increases. As long as the capacitance can be specified with the peak-to-peak value at the input end and the peak-to-peak value at the output end, the destination of the resonance point can be accurately set with the specified capacitance.

Preferably, the plasma processing device described above further includes a capacitive coupling antenna connected to the coil antenna. The controller sets a range for the capacitance of the variable capacitor that includes a first specific capacitance and a second specific capacitance. The first specific capacitance is a capacitance of the variable capacitor within the range and corresponds to a resonance point located at a position that is closest to a connection point of the coil antenna and the capacitive coupling antenna. The second specific capacitance is a capacitance of the variable capacitor that differs from the first specific capacitance. The controller separately executes a process for setting the capacitance of the variable capacitor to the first specific capacitance and a process for setting the capacitance of the variable capacitor to the second specific capacitance.

When the resonance point is located at the connection point of the coil antenna and the capacitive coupling antenna, the peak-to-peak value at the capacitive coupling antenna is relatively low. As the resonance point moves farther away from the connection point of the coil antenna and the capacitive coupling antenna, the peak-to-peak value becomes relatively higher. The capacitance of the variable capacitor is set to the first specific capacitance or the second specific capacitance. This produces a state in which the peak-to-peak value at the capacitive coupling antenna is relatively low or a state in which the peak-to-peak value at the capacitive coupling antenna is relatively high. Thus, the function of the capacitive coupling antenna can be switched so that the capacitive coupling antenna removes deposited material or stops removing deposited material.

Other features and embodiments will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art One embodiment of a plasma processing device will now be described with reference to FIGS. 1 to 3.

Figure 1:
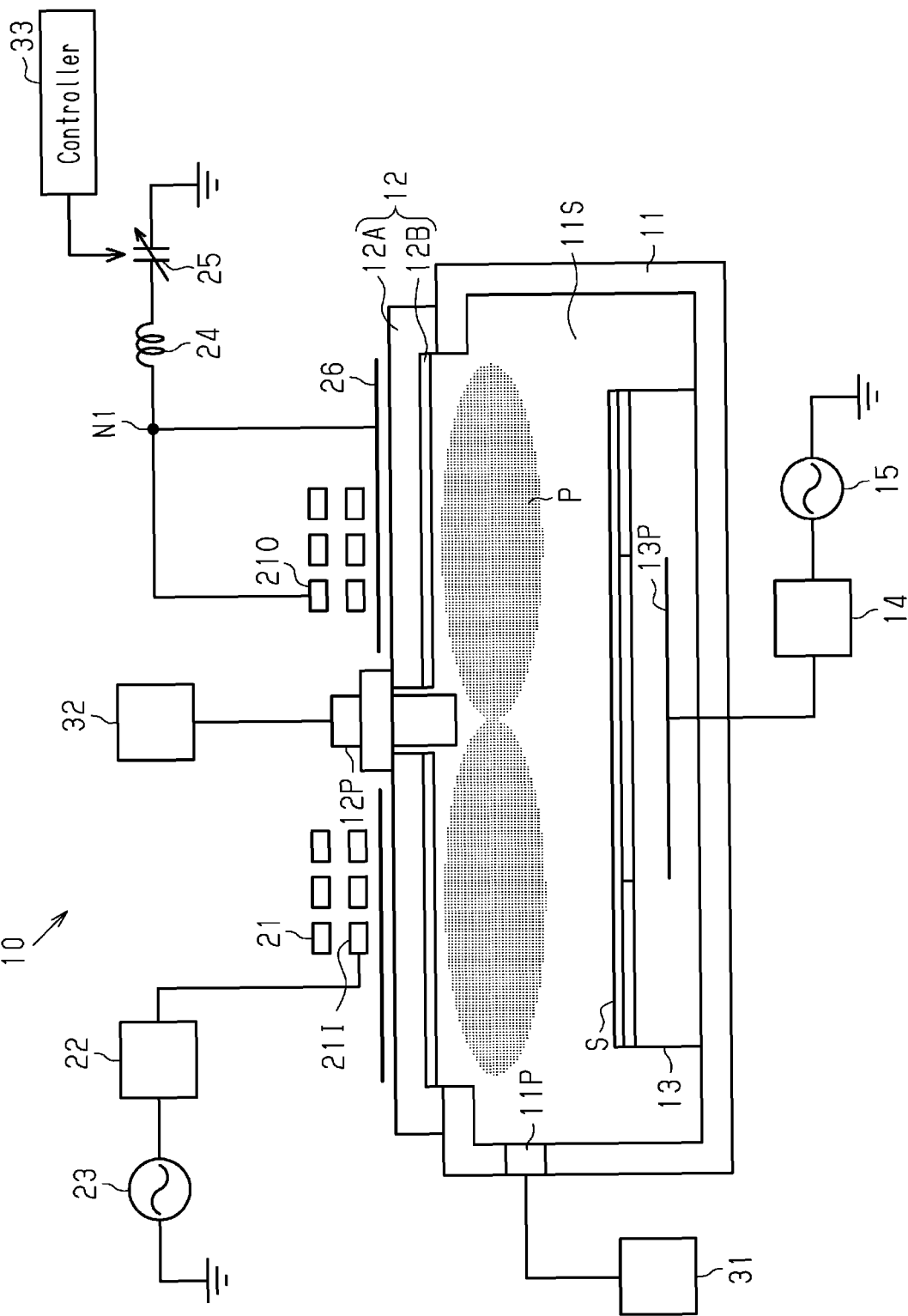
FIG. 1 is a schematic diagram illustrating the configuration of the etching device.

As illustrated in FIG. 1, the etching device 10, which is one example of a plasma processing device, includes a chamber body 11, which is tubular and has a closed lower end, and a dielectric window 12, which closes the open upper end of the chamber body 11. The chamber body 11 and the dielectric window 12 define a chamber 11S.

The chamber body 11 is a structure formed from a metal such as aluminum. The dielectric window 12 includes a base material 12A, which is formed from quartz, and a coating 12B, which is a film formed from a resin such as polyimide. The side of the base material 12A that is closer to the chamber 11S is covered by the coating 12B.

A stage 13 is accommodated in the chamber 11S. A substrate S that is subject to etching is held by the stage 13. A bias electrode 13P, incorporated in the stage 13, is connected via a bias matching device 14 to a bias power supply 15. The bias power supply 15 outputs power at a high frequency of 13.56 MHz. The bias matching device 14 matches the output impedance of the bias power supply 15 with the input impedance of the load receiving the high-frequency power. This reduces reflection waves produced by the load.

An inductively-coupled plasma (ICP) antenna 21, which is one example of a coil antenna, is arranged on the dielectric window 12 at the side opposite to the chamber 11S. The ICP antenna 21 is formed by, for example, two coils. Each coil includes two and a half windings wound in the circumferential direction of the substrate S. The ICP antenna 21 has a predetermined inductance. For example, the inductance of the ICP antenna 21 is, preferably, 0.3 µH or greater and 4.0 µH or less.

The ICP antenna 21 includes an input end 21I and an output end 21O. The input end 21I is the coil end of the lower one of the two coils of the ICP antenna 21 and located toward the outer side of the coil. The output end 21O is the coil end of the upper one of the two coils of the ICP antenna 21 and located toward the center of the coil.

The input end 21I of the ICP antenna 21 is connected via an antenna matching device 22 to an antenna power supply 23. The antenna power supply 23 is one example of a high-frequency power supply and outputs power at, for example, a high frequency of 13.56 MHz. The antenna matching device 22 is one example of a matching circuit. The antenna matching device 22 matches the output impedance of the antenna power supply 23 with the input impedance of the load receiving the high-frequency power from the antenna power supply 23. This reduces reflection waves produced by the load.

The output end 21O of the ICP antenna 21 is connected via a node N1 to an additional inductor 24. The additional inductor 24 is connected via a variable capacitor 25 to ground. Thus, the additional inductor 24 and the variable capacitor 25 form a series circuit connecting the output end 21O of the ICP antenna 21 to ground.

The capacitance C of the variable capacitor 25 may be, for example, within the range from 10 pF or greater to 1000 pF or less. The inductance L of the additional inductor 24 is set to, for example, a value satisfying $\omega L - 1/\omega C = 0$ (where $\omega$ is frequency) with respect to the capacitance C of the variable capacitor 25. In one example, the inductance L of the additional inductor 24 is calculated with a numerical expression using the maximum value within the range of the capacitance C of the variable capacitor 25 so that a resonance point RP is located at the output end 21O of the ICP antenna 21 (refer to FIG. 3). For example, the inductance L of the additional inductor 24 is, preferably, 0.3 µH or greater and 2.0 µH or less.

The capacitance C of the variable capacitor 25 is varied to move the resonance point RP in the ICP antenna 21. This varies a peak-to-peak value, or Vpp, in the ICP antenna 21 from the input end 21I to the output end 21O. In this case, Vpp is the difference between the maximum value and the minimum value of voltage at any given position in the high-frequency circuit (circuit from high-frequency power supply 23 to variable capacitor 25 in FIG. 2) and also referred to as an inter-peak voltage detected at each position.

A capacitive coupling antenna 26 is arranged between the dielectric window 12 and the ICP antenna 21. The capacitive coupling antenna 26 is an electrode arranged above the dielectric window 12 extending radially and parallel to the dielectric window 12. Voltage is applied to the capacitive coupling antenna 26 in a state in which plasma P is generated in the chamber 11S to draw ions toward the inner surface of the dielectric window 12. This removes the material deposited on the inner surface of the dielectric window 12.

The additional inductor 24 and the capacitive coupling antenna 26 are connected in parallel via node N1 to the output end 21O of the ICP antenna 21. Node N1 serves as a connection point of the ICP antenna 21 and the capacitive coupling antenna 26. In the transmission path of high-frequency power, node N1 and the output end 21O are substantially electrical equivalents.

The chamber body 11 includes a discharge port 11P. A discharge unit 31 that discharges fluid from the chamber 11S is connected to the discharge port 11P. The discharge unit 31 includes, for example, a pump and a pressure regulation valve to regulate the pressure of the chamber 11S.

The dielectric window 12 includes a gas supply port 12P. A gas supply unit 32 that supplies the chamber 11S with etching gas is connected to the gas supply port 12P. The gas supply unit 32 is a mass flow controller that supplies sulfur hexafluoride, which is one example of a fluoride-containing gas, and boron trifluoride, which is one example of a boron-containing gas.

The etching device 10 includes a controller 33. The controller 33 controls the etching device 10 and executes various processes to generate plasma P in the chamber 11S.

Figure 2:
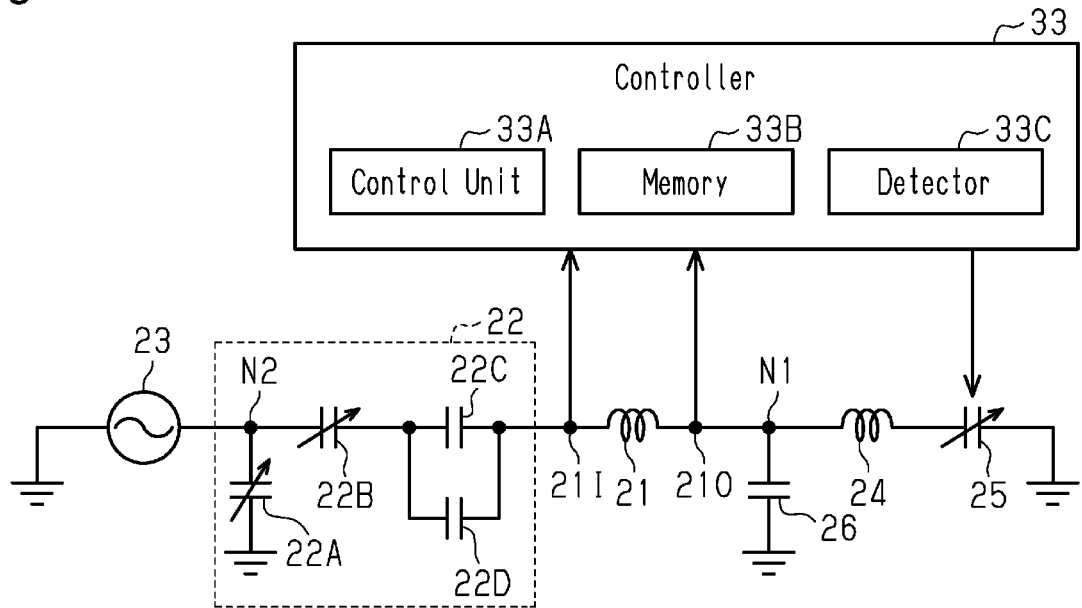
FIG. 2 is a schematic diagram illustrating the configuration of the etching device and a controller.

As illustrated in FIG. 2, the antenna matching device 22 includes, for example, two variable capacitors 22A and 22B and two fixed capacitors 22C and 22D. The two variable capacitors 22A and 22B are connected in parallel via node N2 to the antenna power supply 23. The variable capacitor 22A includes one terminal connected via node N2 to the antenna power supply 23 and another terminal connected to ground. The variable capacitor 22B includes one terminal connected via node N2 to the antenna power supply 23 and another terminal connected via a parallel circuit formed by the two fixed capacitors 22C and 22D to the input end 21I of the ICP antenna 21.

Controller

The controller 33 includes a control unit 33A, a memory 33B, and a detector 33C. The control unit 33A controls and drives each part of the etching device 10. The memory 33B stores programs and processing conditions used to control and drive the etching device 10. The detector 33C detects Vpp at the input end 21I, or input Vpp, and Vpp at the output end 21O, or output Vpp.

In one example, the memory 33B stores, as the processing conditions, a first target value, a second target value, a third target value, and a fourth target value. The first target value is the capacitance C of the variable capacitor 25 for initiating the generation of plasma P. The first target value is one example of a first capacitance. When varying the capacitance C to move the resonance point RP, the first capacitance is the value of the capacitance C corresponding to the resonance point RP located at the position that is the closest to the output end 21O.

The first target value may be obtained through, for example, an experiment that initiates the generation of plasma P with the ICP antenna 21. In the experiment, the capacitance C of the variable capacitor 25 is varied in order, and plasma P is generated at each capacitance C with the ICP antenna 21. Among the used capacitances C, the capacitance C at which the input Vpp was maximal may be set as the first target value.

Alternatively, the first target value may be obtained through a numerical expression using the inductance L of the additional inductor 24 and the range of the capacitance C of the variable capacitor 25. For example, in the numerical expression, within the range of the capacitance C of the variable capacitor 25, the calculated capacitance C at which the output Vpp is minimal may be set as the first target value.

The second target value is the input Vpp and the output Vpp used after the generation of plasma P is initiated. The capacitance C when the input Vpp and the output Vpp are the second target value is one example of a second capacitance. The second capacitance differs from the first capacitance and is, for example, the capacitance C when the input Vpp is substantially equal to the output Vpp.

The second target value may be obtained through, for example, an experiment that continuously generates plasma P with the ICP antenna 21. In the experiment, the capacitance C of the variable capacitor 25 is varied in an ordered manner, and plasma P is generated at each capacitance C with the ICP antenna 21. Among the used capacitances C, the input Vpp and the output Vpp at which the input Vpp is substantially equal to the output Vpp may be used as the second target value.

Alternatively, the second target value may be obtained through a numerical expression using the inductance of the ICP antenna 21, the inductance L of the additional inductor 24, and the capacitance C of the variable capacitor 25. In the numerical expression, within the range of the capacitance C of the variable capacitor 25, the input Vpp and the output Vpp at which the input Vpp is substantially equal to the output Vpp after initiating generation may be set as the second target value.

The third target value is the input Vpp and the output Vpp used after stopping the removal of the material deposited on the inner surface of the dielectric window 12 with the capacitive coupling antenna 26. The capacitance C when the input Vpp and the output Vpp are the third target value is a first specific capacitance. The first specific capacitance is, for example, the capacitance C corresponding to the resonance point RP located at the position that is the closest to node N1. In the present embodiment, the output end 21O and node N1 are substantially electrical equivalents. Thus, the Vpp at the output Vpp coincides with that at node N1. Accordingly, the first specific capacitance coincides with the first capacitance.

The third target value may be obtained through a numerical expression using the inductance L of the additional inductor 24 and the range of the capacitance C of the variable capacitor 25. For example, within the range of the capacitance C of the variable capacitor 25, the numerical expression is used to calculate the capacitance C at which Vpp at node N1 is minimal. The input Vpp and the output Vpp when the calculated capacitance C is applied may be set as the third target value.

The fourth target value is the input Vpp and the output Vpp used when removing the material deposited on the inner surface of the dielectric window 12 with the capacitive coupling antenna 26. The fourth target value differs from the third target value. The capacitance C when the input Vpp and the output Vpp are the fourth target value is a second specific capacitance. The second specific capacitance is a capacitance C that differs from the first specific capacitance.

The fourth target value is, for example, the same as the second target value. In this case, the second specific capacitance coincides with the second capacitance. As long as the fourth target value differs from the third target value, the fourth target value may differ from the second target value.

The fourth target value may be obtained through, for example, an experiment that continuously generates plasma P with the ICP antenna 21. In the experiment, the capacitance C of the variable capacitor 25 is varied in order, and plasma P is generated at each capacitance C with the ICP antenna 21. Among the used capacitances C, the input Vpp and the output Vpp at which the output Vpp allows for removal of the deposited material with the capacitive coupling antenna 26 may be set as the fourth target value.

Operation of Embodiment

Figure 3:
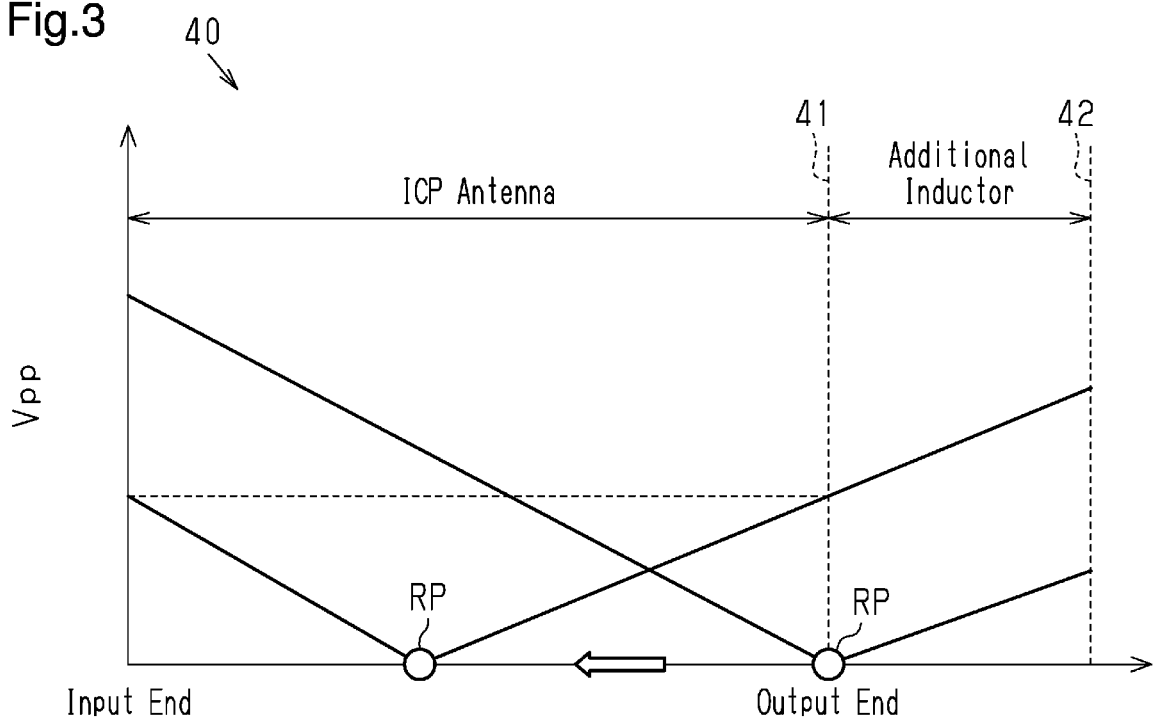
FIG. 3 is a graph illustrating a peak-to-peak value in an ICP antenna and an additional inductor.

With reference to FIG. 3, the operation of the etching device 10 will now be described. In FIG. 3, graph 40 schematically illustrates Vpp at different positions in the ICP antenna 21 and the additional inductor 24 when initiating the generation of plasma P and after the generation of plasma P is initiated. In the horizontal axis of graph 40 illustrated in FIG. 3, the left end indicates the input end 21I, broken line 41 indicates the output end 21O and node N1, and broken line 42 indicates the connection point of the additional inductor 24 and the variable capacitor 25.

The control unit 33A controls the discharge unit 31 to discharge gas until the pressure of the chamber 11S becomes a predetermined pressure. Then, the control unit 33A controls the gas supply unit 32 to supply the chamber 11S with etching gas. Further, the control unit 33A refers to the first target value stored in the memory 33B to set the first capacitance to the capacitance C of the variable capacitor 25. The control unit 33A controls the antenna power supply 23 to supply the ICP antenna 21 with high-frequency power. This initiates the generation of capacitive plasma, which is one example of plasma P, in the chamber 11S.

As illustrated in FIG. 3, when initiating the generation of plasma P, the control unit 33A sets the first capacitance to the capacitance C of the variable capacitor 25 so that the resonance point RP becomes located at the position that is the closest to the output end 21O. The input Vpp becomes maximal when the resonance point RP is located at the position that is the closest to the output end 21O of the ICP antenna 21. As a result, when initiating the generation of plasma P with the ICP antenna 21, the resonance point RP is moved to near the output end 21O so that capacitive plasma can be easily generated in the vicinity of the input end 21I. This stably initiates generation of plasma P with the ICP antenna 21.

In a structure that does not include the additional inductor 24, even if the resonance point RP is moved toward the output end 21O, the reactance ($1/\omega X$) of the variable capacitor 25 will displace the resonance point RP from the output end 21O toward the input end 21I. In contrast, when the additional inductor 24 is arranged between the ICP antenna 21 and the variable capacitor 25, the combined reactance of the additional inductor 24 and the variable capacitor 25 will be expressed as $\omega L - 1/\omega C$. The inductance L of the additional inductor 24 and the capacitance C of the variable capacitor 25 are set to satisfy $\omega L - 1/\omega C = 0$ so that the resonance point RP can be arranged closer to the output end 21O.

The output end 21O and node N1 are substantially electric equivalents. Thus, when initiating the generation of plasma P, the resonance point RP is located at node N1. The capacitance C set by the control unit 33A when initiating the generation of plasma P is the first capacitance and the first specific capacitance. When the resonance point RP is located at node N1, Vpp at node N1, or Vpp of the capacitive coupling antenna 26, is minimal. This limits the capacitive plasma generated by the capacitive coupling antenna 26. Accordingly, when the generation of plasma P is initiated, the removal of the material deposited on the inner surface of the dielectric window 12 with the capacitive coupling antenna 26 is stopped.

After the generation of plasma P is initiated, the control unit 33A refers to the second target value stored in the memory 33B and the actually measured values of the input Vpp and the output Vpp detected by the detector 33C to set the second capacitance to the capacitance C of the variable capacitor 25.

In one example, the control unit 33A uses control data so that the measured values of the input Vpp and the output Vpp detected by the detector 33C approaches the second target value. The control data is, for example, a relational expression or table associating the difference of the second target value and the measured value with capacitance C so that the measured value of the detector 33C approaches the second target value. As the resonance point RP moves from the output end 21O toward the input end 21I, the output Vpp increases and the input Vpp decreases. Thus, a relational expression or table indicating such a relationship may be used as the control data. The control data is stored in the memory 33B.

After the generation of plasma P is initiated, the control unit 33A sets the capacitance C of the variable capacitor 25 as the second capacitance determined from the second target value and the actually measured values of the input Vpp and the output Vpp. The control unit 33A sets the second capacitance to the capacitance C to move the resonance point RP from the output end 21O to a position between the input end 21I and the output end 21O so that the input Vpp becomes substantially equal to the output Vpp.

During the generation of plasma P, after capacitive plasma is initially generated, inductive plasma, which is one example of plasma P, is induced from the capacitive plasma. When the resonance point RP is moved away from the output end 21O after capacitive plasma is generated, the input Vpp is maximized and then decreased. This avoids a biased distribution of the capacitive plasma when inductive plasma is induced. As a result, after the generation of plasma P is initiated, plasma P is uniformly distributed when inductive plasma is induced.

In the present embodiment, after the generation of plasma P is initiated, the capacitance C set by the control unit 33A is the second capacitance and the second specific capacitance. The resonance point RP moves from the output end 21O to a position between the input end 21I and the output end 21O so that Vpp at node N1, or Vpp at the capacitive coupling antenna 26, is higher than when the resonance point RP is located at the output end 21O. As a result, after the generation of plasma P is initiated, capacitive plasma is generated by the capacitive coupling antenna 26. Thus, the capacitive coupling antenna 26 removes the material deposited on the inner surface of the dielectric window 12 and limits the deposition of new material on the inner surface of the dielectric window 12.

In one example, the etching device 10 generates plasma P using the etching conditions illustrate below. The etching conditions are not limited to the etching conditions illustrate below.

Etching Conditions
   substrate: sapphire substrate
   antenna high-frequency power: 2100 W
   bias high-frequency power: 1000 W
   frequency of bias high-frequency power: 2 MHz
   etching gas: BCl3
   etching gas flow rate: 150 sccm The above embodiment has the advantages described below.

(1) The control unit 33A varies the capacitance C of the variable capacitor 25 to control the position of the resonance point RP. The additional inductor 24 arranged between the ICP antenna 21 and the variable capacitor 25 allows the resonance point RP to be located closer to the output end 21O of the ICP antenna 21.

(2) When initiating the generation of plasma P with the ICP antenna 21, the first capacitance is set to the capacitance C of the variable capacitor 25 so that the resonance point RP becomes located at the position that is the closest to the output end 21O. This maximizes the input Vpp. Thus, capacitive plasma can be easily generated. This stably initiates the generation of plasma P with the ICP antenna 21.

(3) After the generation of plasma P is initiated, the second capacitance is set to the capacitance C of the variable capacitor 25 so that the input Vpp and the output Vpp approach the second target value. This moves the resonance point RP from the output end 21O to a position between the input end 21I and the output end 21O. As a result, the input Vpp becomes substantially equal to the output Vpp. Biased distribution of plasma P is limited by capacitive plasma. This uniformly distributes plasma P after generation of the plasma P is initiated.

(4) When the control unit 33A specifies the second capacitance, the measured values of the input Vpp and the output Vpp detected by the detector 33C are used to accurately move the resonance point RP from the output end 21O toward the input end 21I.

(5) When the generation of plasma P is initiated, the first specific capacitance is set to the capacitance C of the variable capacitor 25 to stop removing deposited material with the capacitive coupling antenna 26. After the generation of plasma P is initiated, the second specific value is set to the capacitance C of the variable capacitor 25 to remove deposited material with the capacitive coupling antenna 26. The capacitance C of the variable capacitor 25 is set to the first specific capacitance or the second specific capacitance. This relatively decreases Vpp with the capacitive coupling antenna 26 or relatively increases Vpp with the capacitive coupling antenna 26. As a result, the function of the capacitive coupling antenna 26 can be switched so that the capacitive coupling antenna 26 removes deposited material or stops removing deposited material.

The above embodiment can be modified as described below.

In the above embodiment, the capacitive coupling antenna 26 is connected via node N1 to the output end 21O of the ICP antenna 21. However, there is no limitation to such a configuration. For example, an electrode may be arranged at any position between the input end 21I and output end 21O of the ICP antenna 21, and the capacitive coupling antenna 26 may be connected to the electrode.

In a specific example, a terminal is arranged at a position where the resonance point RP is located when the input Vpp and the output Vpp are the second target value, and the capacitive coupling antenna 26 is connected to the terminal. In this case, after the generation of plasma P is initiated, the capacitance C set by the control unit 33A is the second capacitance and the first specific capacitance. Thus, after the generation of plasma P is initiated, Vpp of the capacitive coupling antenna 26 is minimal. This limits the capacitive plasma generated by the capacitive coupling antenna 26.

After the generation of plasma P is initiated, the control unit 33A sets capacitance C as the second capacitance, that is, sets the second specific capacitance from the first specific capacitance, to move the resonance point RP from the connection point of the ICP antenna 21 and the capacitive coupling antenna 26. In this case, the second specific capacitance is any capacitance that differs from the second capacitance and may be, for example, the first capacitance. This increases Vpp at the connection point. As a result, capacitive plasma is generated with the capacitive coupling antenna 26. As described above, the functions of the capacitive coupling antenna 26 can be switched even if the capacitive coupling antenna 26 is connected to a position corresponding to the resonance point RP when the input Vpp and the output Vpp are the second target value.

In the above embodiment, the etching device 10 includes the capacitive coupling antenna 26. However, there is no limitation to such a configuration. For example, the capacitive coupling antenna 26 can be omitted from the etching device 10 as long as there is another means for removing deposited material from the inner surface of a top plate or the like.

In the above embodiment, after the generation of plasma P is initiated, the control unit 33A uses the measured values of the input Vpp and the output Vpp to specify the second capacitance. However, there is no limitation to such a configuration. For example, the second capacitance may be specified by referring to only the measured value of the input Vpp. In this case, instead of the measured value of the output Vpp, the output Vpp that is used can be calculated from, for example, the inductance L of the additional inductor 24 and the first capacitance set for the variable capacitor 25 when the generation of plasma P is initiated.

When the control unit 33A specifies the second capacitance with the measured values of the input Vpp and the output Vpp, the destination to where the resonance point RP is moved by the specified second capacitance will be set more accurately than when the second capacitance is specified by referring to only the measured value of the input Vpp. However, when the second capacitance is specified by referring to only the measured value of the input Vpp, there will be no need for the detector 33C to detect the output Vpp. Further, the calculation process for specifying the second capacitance can be simplified.

In the above embodiment, the control unit 33A uses the second target value and the measured values of the input Vpp and the output Vpp to specify the second capacitance. Instead, the second capacitance that is used may be obtained in advance through a numerical expression using, for example, the inductance of the ICP antenna 21, the inductance L of the additional inductor 24, and the capacitance C of the variable capacitor 25. In this case, the detector 33C does not need to detect the input Vpp and the output Vpp. Further, the calculation process for specifying the second capacitance can be simplified.

The ICP antenna 21 can include, for example, one coil or three or more coils.

The plasma processing device is not limited to the etching device 10 and may be, for example, a film formation device that produces deposited material from a film formation gas or a surface processing device that irradiates the surface of a subject with plasma.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. A plasma processing device, comprising:
a coil antenna including an input end and an output end;
a capacitive coupling antenna connected to the coil antenna;
a series circuit including an additional inductor and a variable capacitor connected in series; and a controller that varies a capacitance of the variable capacitor;
  wherein the input end of the coil antenna is connected via a matching circuit to a high-frequency power supply, wherein the output end of the coil antenna is connected to the additional inductor, wherein the additional inductor is connected via the variable capacitor to ground, and wherein the controller sets a range for the capacitance of the variable capacitor that includes a first specific capacitance and a second specific capacitance, and wherein the first specific capacitance is a capacitance of the variable capacitor within the range and corresponds to a resonance point located at a position that is closest to a connection point of the coil antenna and the capacitive coupling antenna.

2. The plasma processing device according to claim 1, wherein the controller sets a range for the capacitance of the variable capacitor that includes a first capacitance, wherein the first capacitance is a capacitance of the variable capacitor within the range and corresponds to a resonance point located at a position that is closest to the output end, and wherein the controller executes a process for setting the capacitance of the variable capacitor to the first capacitance when initiating generation of plasma with the coil antenna.

3. The plasma processing device according to claim 2, wherein the controller uses a peak-to-peak value at the input end after the generation of plasma is initiated to specify the capacitance of the variable capacitor for moving the resonance point from the output end toward the input end.

4. The plasma processing device according to claim 3, wherein the controller further uses a peak-to-peak value at the output end to specify the capacitance of the variable capacitor.

5. The plasma processing device of claim 1, wherein the second specific capacitance is a capacitance of the variable capacitor that differs from the first specific capacitance, and wherein the controller separately executes a process for setting the capacitance of the variable capacitor to the first specific capacitance and a process for setting the capacitance of the variable capacitor to the second specific capacitance.

6. The plasma processing device of claim 3, wherein the second specific capacitance is a capacitance of the variable capacitor that differs from the first specific capacitance, and wherein the controller separately executes a process for setting the capacitance of the variable capacitor to the first specific capacitance and a process for setting the capacitance of the variable capacitor to the second specific capacitance.

* * * * *